(12) United States Patent
Robert et al.

(10) Patent No.: US 7,600,428 B2
(45) Date of Patent: Oct. 13, 2009

(54) TRIAXIAL MEMBRANE ACCELEROMETER

(75) Inventors: Philippe Robert, Grenoble (FR);
Sébastien Hentz, Grenoble (FR)

(73) Assignee: Commissariat a l'Energie Atomique (FR)

( * ) Notice: Subject to any disclaimer, the term of this patent is extended or adjusted under 35 U.S.C. 154(b) by 5 days.

(21) Appl. No.: 11/686,346

(22) Filed: Mar. 14, 2007

(65) Prior Publication Data

US 2007/0214891 A1  Sep. 20, 2007

(30) Foreign Application Priority Data

Mar. 14, 2006  (FR)  ..................... 06 02216

(51) Int. Cl.
    *G01P 15/125*  (2006.01)
(52) U.S. Cl. .................... 73/514.32; 73/510; 73/514.38
(58) Field of Classification Search ............. 73/514.32, 73/514.29, 514.38, 514.36, 510, 511
    See application file for complete search history.

(56) References Cited

U.S. PATENT DOCUMENTS

| | | | |
|---|---|---|---|
| 5,591,910 A * | 1/1997 | Lin .......................... | 73/514.38 |
| 6,744,173 B2 * | 6/2004 | Behin et al. .................. | 310/309 |
| 6,761,070 B2 * | 7/2004 | Zarabadi et al. ........... | 73/514.32 |
| 6,845,670 B1 * | 1/2005 | McNeil et al. ............ | 73/514.32 |
| 6,859,048 B2 * | 2/2005 | Okada et al. ................ | 324/681 |
| 6,990,864 B2 * | 1/2006 | Sakai ....................... | 73/514.32 |
| 6,997,054 B2 * | 2/2006 | Tsugai ..................... | 73/504.12 |
| 7,194,905 B2 * | 3/2007 | Yamamoto et al. ........ | 73/514.32 |
| 7,258,010 B2 * | 8/2007 | Horning et al. .......... | 73/514.32 |
| 7,270,003 B2 * | 9/2007 | Sassolini et al. ......... | 73/514.32 |
| 7,293,460 B2 * | 11/2007 | Zarabadi et al. .......... | 73/514.32 |
| 7,337,671 B2 * | 3/2008 | Ayazi et al. ............... | 73/514.32 |
| 7,350,415 B2 * | 4/2008 | LaFond .................... | 73/514.32 |
| 7,430,915 B2 * | 10/2008 | Yasuda et al. .................. | 73/652 |

FOREIGN PATENT DOCUMENTS

| | | |
|---|---|---|
| EP | 0 744 603 A1 | 11/1996 |
| JP | 2004/150993 | 5/2004 |
| WO | 03/083492 | 10/2003 |

OTHER PUBLICATIONS

"A Z-Axis Differential Capacitive SOI Accelerometer with Vertical Comb Electrodes," Toshiyuki Tsuchiya, Hirofumi Funabashi; IEEE Journal, 2004, pp. 524-527.*
Lemkin M A et al: "A 3-axis force balanced accelerometer using a single proof-mass"; 1997 International Conference On Solid-State Sensors and Actuators. Digest of Technical Papers. Transducers 97. Chicago, IL, Jun. 16-19, 1997. Sessions 3A1-4D3. Papers No. 3A1. 01-4D3.14P, International Conference on Solid-State Sensors and ACTU, vol. 2, Jun. 16, 1997, pp. 1185-1188, XP010240691; ISBN: 0-7803-3829-4.

* cited by examiner

*Primary Examiner*—Helen C. Kwok
(74) *Attorney, Agent, or Firm*—Lowe Hauptman Ham & Berner, LLP

(57) ABSTRACT

The invention relates to accelerometer structures micro-machined according to micro-electronics technologies. The accelerometer according to the invention comprises a substrate, an elastically deformable thin-layer membrane suspended above the substrate and secured to the substrate at its periphery, a proof mass suspended above the membrane and linked to the latter by a central stud, and capacitive interdigitated combs distributed about the mass, having movable plates secured to the mass and fixed plates secured to the substrate. The fixed plates and movable plates of the various combs are of differentiated heights to help in the discrimination of the upward and downward vertical accelerations.

17 Claims, 5 Drawing Sheets

TRIAXIAL MEMBRANE ACCELEROMETER

RELATED APPLICATIONS

The present application is based on, and claims priority from, application Ser. No. 06/02216, filed Mar. 14, 2006, the disclosure of which is hereby incorporated by reference herein in its entirety.

FIELD OF THE INVENTION

The invention relates to micro-machined inertial sensors, that is to say ones made by technologies very close to those which are used in micro-electronics. It relates more particularly to accelerometers.

BACKGROUND OF THE INVENTION

Micro-machining makes it possible to produce accelerometers of very reduced size at relatively low cost since it is simultaneously possible to machine a large number of accelerometers on one and the same support slice before dividing them into individual chips.

However, even with this type of technology, it remains desirable to further reduce the dimensions and costs. Specifically, there are more and more applications in the mass-market sector (automobiles, mobile telephony, etc.) and in the professional sector (aeronautics, industrial robotics, etc.) where cost, on the one hand, and bulkiness, on the other hand, are major issues, the cost being moreover in general inversely proportional to size for a given technology.

In particular, in applications where one needs to detect accelerations in the three dimensions in space, three simple accelerometers were firstly used, each oriented in a different direction so as to measure the accelerations in each of these directions. This solution is cumbersome and expensive since it demands three micro-machined components and a mounting of these three components in different but very precise orientations on a common platform.

It has therefore been sought to produce triaxial accelerometers using a micro-machined common proof mass, provided with means for detecting the displacements of the mass along three independent axes.

In particular, triaxial accelerometers have been proposed in which the proof mass is relatively thick (100 to 200 micrometers for example) because it is sliced through the whole thickness of a silicon substrate. Detection is capacitive or piezoelectric or piezoresistive. This type of production involves fabrication by adhesive bonding of several silicon slices (or other materials): in general three slices; the technology is fairly expensive since it is necessary to envisage very deep etchings to define the proof mass, and these deep etchings then require significant surface areas, therefore corresponding bulkiness. Moreover, these sensors are often produced using substrate transfer techniques, thereby posing problems of dimensional inaccuracy in the direction perpendicular to the substrate, the response of these sensors to accelerations, that is to say the amplitude of the output signal as a function of acceleration, may then be inaccurate, not very linear. Moreover, the sensitivity axes are not very independent, that is to say an acceleration along one axis induces spurious signals on the outputs corresponding to the other axes. It is therefore necessary to envisage compensation systems, this also being a drawback.

To avoid these drawbacks, triaxial accelerometers whose proof mass is made not in the global thickness of a silicon substrate but in the much lower thickness of a layer suspended above a substrate have also been proposed. Detection is capacitive, with interdigitated combs for the horizontal axes, and with plane capacitances (between the proof mass and the substrate situated below the mass). If it is necessary to slave the position of the mass to a central rest position, as is often desirable to improve performance, it is possible to do so along the horizontal axes, by using interdigitated combs assigned to this slaving, but it is not possible to do so in both directions (up and down) of the vertical axis without considerably complicating the technology.

The article "A 3-Axis Force Balanced Accelerometer Using a single Proof-Mass", by Mark A. Lemkin, Bernhard E. Boser, David Auslander, Jim H. Smith, published in the IEEE Transducers '97 proceedings, following the conference in 1997 "International Conference on Solid-State Sensors and Actuators", describes such an accelerometer with surface technology machined proof mass.

SUMMARY OF THE INVENTION

To limit the drawbacks of the prior art triaxial accelerometer structures, the present invention proposes an accelerometer structure comprising a substrate, an elastically deformable thin-layer membrane suspended above the substrate and secured to the substrate at its periphery, a proof mass suspended above the membrane and linked to the latter by a central stud, and capacitive interdigitated combs distributed about the mass, having movable plates secured to the mass and fixed plates secured to the substrate.

The mass being suspended above the membrane and linked to the latter by a point-like tag, the entire periphery of the membrane is available for distributing interdigitated combs there. Capacitive combs for the measurement of displacements can be envisaged, but possibly also capacitive combs for the slaving of the mass to a central rest position.

Preferably, the fixed plates of some of the capacitive combs have a height, measured in the sense perpendicular to the membrane, that is smaller than the height of the movable plates of these combs, and the movable plates of some combs have a height in the sense perpendicular to the membrane that is smaller than the height of the fixed plates of these combs; in this way, the difference of the capacitances of two combs thus rendered dissymmetric will vary in opposite senses depending on whether the mass moves vertically (perpendicularly to the membrane) in one sense or in the other.

Preferably, on each side of the membrane are envisaged two combs, one having fixed plates higher than the movable plates and the other having movable plates higher than the fixed plates ; two combs facing one another on two opposite sides also have, the one, fixed plates higher than the movable plates and, the other, movable plates higher than the fixed plates.

Preferably again, the spacings between plates of the two combs on one and the same side vary in opposite senses for one and the same sense of horizontal displacement of the proof mass.

It is also preferably envisaged that two combs facing one another on two opposite sides have spacings between plates which vary in the same sense for one and the same displacement of the proof mass parallel to these sides.

Finally, it is preferably envisaged that the arrangement of the sensor as a whole is symmetric in order that the capacitances at rest (in the absence of accelerations) of all the interdigitated combs are identical.

In the absence of slaving of the position of the proof mass, the measurement of acceleration along the three axes is done by a measurement (direct or indirect) of the capacitances or variations in capacitances of the interdigitated combs and of the linear combinations of the various measurements so as to extract the components of variations due to the various components of the acceleration.

Typically, the measurement of the acceleration along a horizontal axis parallel to two sides of the proof mass is done by a linear combination of the capacitance values of four combs situated along these sides. The measurement of the acceleration along a vertical axis perpendicular to the membrane is done by a linear combination of the capacitance values of eight combs, this combination being the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

Slaving is also possible. Additional combs on the four sides can be designed to effect a slaving by electrostatic force so as to restore the mass to its rest position in the presence of an acceleration which tends to separate it from this rest position. In this case, the acceleration measurement is done not by direct or indirect measurement of the capacitances of the interdigitated combs but by measurement of the slaving voltages or currents necessary to keep the capacitances of the combs at their rest values. It is also possible to use the same combs for measurement and slaving by virtue for example of a time-division multiplexing with two alternated phases: electrostatic force application phase alternated with a capacitance measurement phase.

BRIEF DESCRIPTION OF DRAWINGS

Other characteristics and advantages of the invention will appear on reading the detailed description which follows and which is given with reference to the appended drawings in which.

DETAILED DESCRIPTION OF PREFERRED EMBODIMENTS

Figure 1:
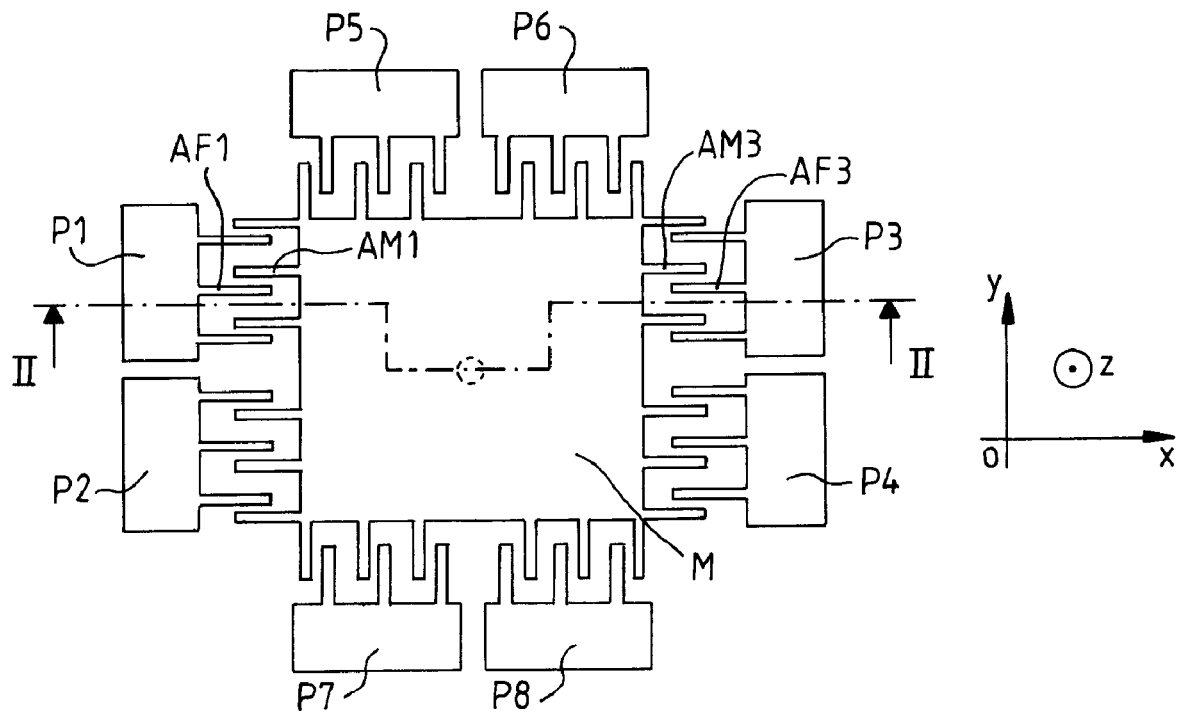
FIG. 1 represents a diagrammatic view from above of the accelerometer according to the invention.

In the view from above of FIG. 1 is seen a movable proof mass M, of for example rectangular or square or indeed even circular shape, provided on each of its sides with interdigitated capacitive combs. Interdigitated combs are conventionally used for the measurement of the displacements of the proof mass in micro-machined accelerometers. They are variable capacitances having movable plates which are comb fingers secured to the proof mass and fixed plates which are comb fingers secured to fixed portions of a substrate of the accelerometer. There is at least one interdigitated comb on each side, but preferably two combs per side. If the accelerometer is of slaved type there may be additional combs having an electrostatic motor function, but this is not compulsory, the same combs being able to serve for measurement and for slaving.

The capacitance of each comb at rest is defined by the number of plates in parallel, by the surface area of the individual plates opposite one another, and by the spacing at rest between the plates. During the displacements of the proof mass, the spacing can vary, but the opposing surface area can also vary, and these two types of variation contribute to the global capacitance variations which will be measured. Only three pairs of plates are represented for each comb in FIG. 1, but in practice the number of plates is much higher so as to obtain sufficient capacitance.

By way of preferential example, represented in FIG. 1 is a structure with two combs per side of the mass: combs P1, P2 on a first side parallel to a first measurement axis Oy; combs P3, P4 facing the combs P1 and P2 on an opposite side; combs P5, P6 on a side parallel to a second measurement axis Ox; combs P7, P8 symmetric with the combs P5, P6 on the opposite side. The two combs on one and the same side, for example P1 and P2, are arranged with inverse symmetry in order that a displacement of the mass in one sense causes the spacing of the plates of one of the combs (P1 for example) to increase and simultaneously causes the spacing of the plates of the other comb (P2) to decrease, so as to be able to more easily work differentially. It will be noted that at rest the plates of the movable fingers are not at the centre of the gap between fixed fingers and vice versa, and it is this off-centring which is inverted for the two combs situated on one and the same side. For combs situated facing one another on two opposite sides, as for example P1 and P3, the arrangement of the plates is preferably such that the spacings between plates vary in the same sense for a displacement of the mass in the direction of these sides (Oy). Consequently, in this case, two diagonally opposite combs, such as P1 and P4 or P2 and P3 have capacitances which vary in mutually inverse senses for a displacement in the direction of the sides which carry them.

One therefore has the following preferred arrangement:
P1 and P3: same variation in capacitance for a displacement in the direction Oy; P2 and P4: opposite variation;
P5 and P7: same variation in capacitance for a displacement in the direction Ox; P6 and P8: opposite variation.

Figure 2:
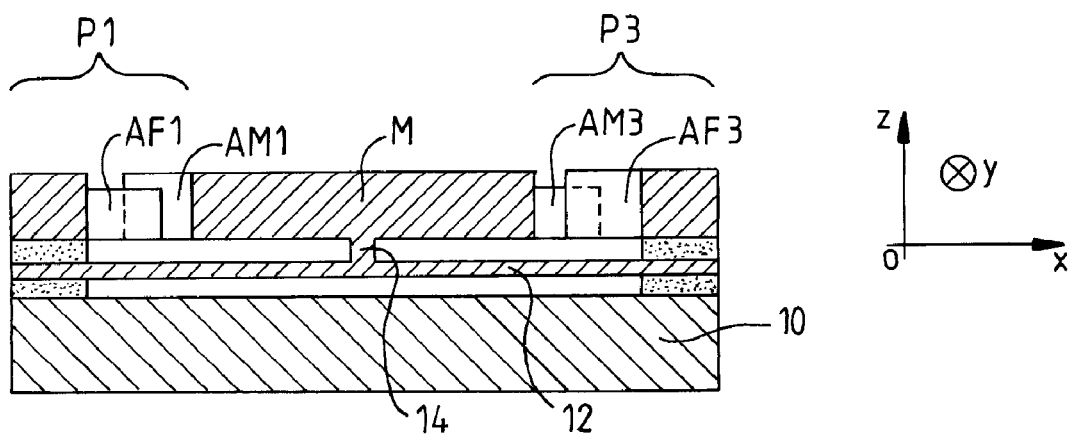
FIG. 2 represents a view in section along the broken line II-II of FIG. 1.

FIG. 2 represents a view in vertical section of the accelerometer, assumed at rest, machined in a substrate 10 which is preferably made of silicon. The proof mass M is supported only at its centre by a fine elastically deformable membrane 12 whose periphery is secured to the substrate 10. A central stud 14 of small dimensions links the centre of the proof mass to the centre of the membrane. The stud 14 forms a point-like attachment of the mass to the centre of the membrane. The proof mass deforms the membrane when it tends to move under the effect of an acceleration, the deformation and the displacement of the mass being limited by the restoring force exerted by the membrane. The latter tends to restore the mass to the rest position in the absence of acceleration.

The membrane is suspended above the substrate 10 with a sufficient empty gap to allow a vertical motion of the membrane in the presence of a downward vertical acceleration in the range of the accelerations that the sensor is intended to measure. Likewise, a free gap is left above the membrane to permit a displacement of the membrane in the presence of an upward acceleration. These gaps can be very small in the case where the accelerometer operates with slaving of the position of the mass.

For the measurement of the horizontal accelerations along the axis Oy, the variations in capacitance due to the combs P1, P2 and P3, P4 are mainly used. Specifically, these variations in capacitance result from a modification of spacing (or interval) between the plates of these combs and the capacitances are particularly sensitive to these variations in spacing (interval). It should be noted however that more limited variations in capacitance also exist on the combs of the other sides during this displacement along Oy but we shall see that matters are contrived so that these variations neutralize one another.

For the measurement of the vertical accelerations, we exploit the fact that a priori the vertical displacement of the movable plates can modify the movable plate surface area facing a fixed plate. If the fixed plates have exactly the same height as the movable plates and if they are exactly facing the latter at rest, then a vertical displacement of the movable mass will decrease the facing surface areas and the resulting decrease in capacitance can be measured. Consequently, it is possible to observe a variation of all the capacitances whose facing plate surface areas are modified following a vertical displacement. However, this solution does not make it possible to distinguish an upward acceleration from a downward acceleration since the variation in capacitance is the same in both cases: it is a reduction in capacitance proportional to the vertical displacement distance.

To distinguish the upward accelerations from the downward accelerations, a dissymmetry of the fixed and movable plates is envisaged according to the invention in the following manner: the combs are constituted with fixed plates having a different height from the height of the movable plates; for one of the combs it is the movable plate which is higher than the fixed plate; for the other it is the converse. In the figures, the comb P1 has fixed plates AF1 of smaller height than the movable plates AM1, while the comb P3 facing on the opposite side has movable plates AM3 of smaller height than the fixed plates AF3. All the plates of one and the same comb are preferably identical and the combs therefore globally exhibit these differences in plate heights.

It will be noted that this height dissymmetry for the discrimination of the vertical and horizontal accelerations constitutes per se an advantageous arrangement independently of the mode of support and of linkage (central stud, membrane) of the proof mass to the substrate, so long as the interdigitated combs which surround the mass serve at one and the same time for the measurement of the vertical accelerations and of the horizontal accelerations.

FIG. 2 represents the accelerometer in the absence of acceleration.

Figure 3:
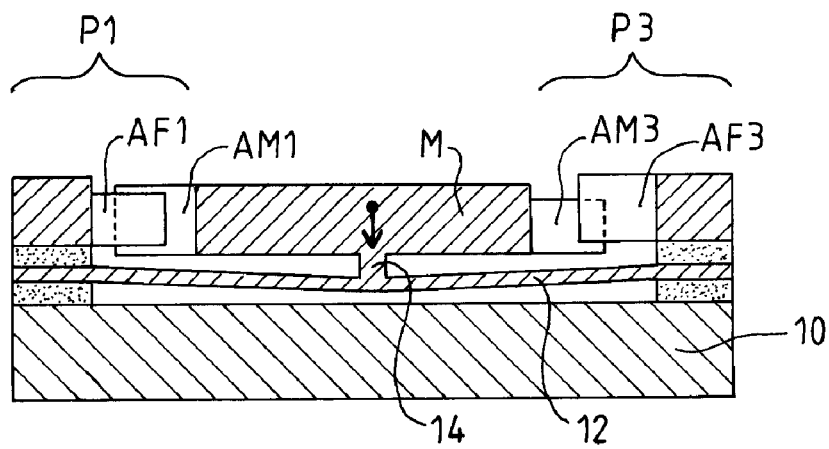
FIG. 3 represents a view in section showing the displacement of the proof mass in the presence of a downward acceleration along the vertical axis Oz perpendicular to the plane of FIG. 1.

FIG. 3 represents the same vertical section as in FIG. 2, in the presence of a downward vertical acceleration (in the absence of horizontal acceleration), showing with an exaggeration of scale the respective positions of the plates AF1 and AM1 on the one hand, AF3 and AM3 on the other. The proof mass moves downwards, the movable plate AM3 of the right comb descends below the fixed plate AF3 and the facing plate surface areas decrease; the capacitance of the comb P3 decreases. But the fixed plate AF1 on the other side remains completely facing the movable plate AM1 which is higher, because the height difference is at least equal to the maximum possible height of displacement of the mass; the capacitance of the comb P1 does not decrease.

Conversely, if the proof mass moves upwards, the reverse holds, the capacitance of the comb P1 decreases, that of the comb P3 does not decrease. In this way it is therefore possible to discriminate the positive and negative accelerations along the vertical axis Oz.

Figure 4:
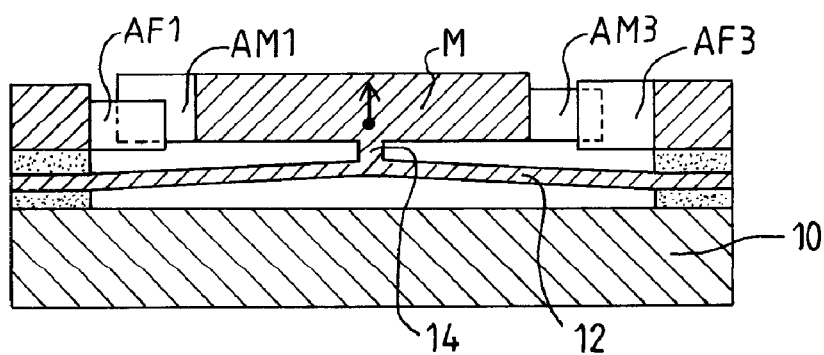
FIG. 4 represents the displacement of the proof mass in the presence of an upward acceleration along the vertical axis Oz.

FIG. 4 represents the accelerometer for an upward vertical acceleration.

Preferably, the eight combs of the structure represented in FIG. 2 are thus dissymmetric pairwise such as P1 and P3, that is to say the fixed plates of a comb (P1, P4, P6, P7) are lower than the movable plates, and conversely the movable plates of the combs situated facing on the opposite side (respectively P3, P2, P8, P5) are lower than the fixed plates. The arrangement is thus very symmetric but other arrangements could also be envisaged, for example an arrangement in which only four combs, or indeed even only two, have fixed and movable plates of different heights so as to ensure discrimination of the vertical displacements of the proof mass, the others having fixed and movable plates of the same height.

Figure 5:
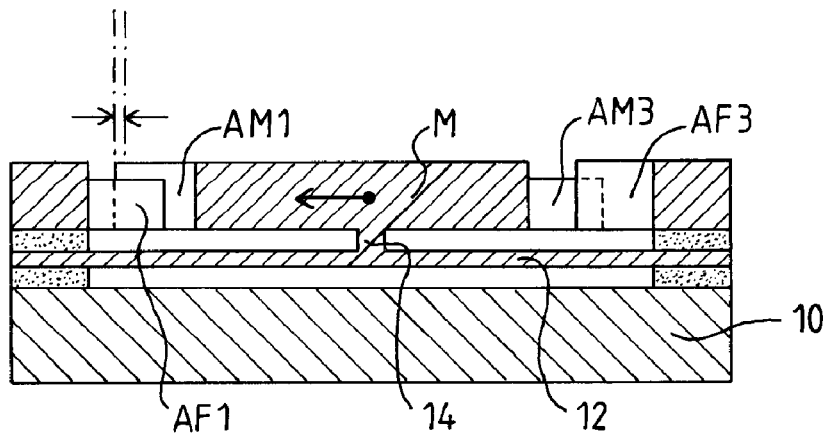
FIG. 5 represents the displacement of the proof mass in the presence of a horizontal acceleration towards the left, along the axis Ox.

FIG. 5 represents a view for a horizontal acceleration along Ox, towards the left. The force exerted on the proof mass tends to displace the mass towards the left and tends to produce an increase of the facing plate surface areas for the comb P1 and a decrease of the facing surface areas for the comb P3, therefore an increase of the capacitance of the comb P1 and a decrease of that of the comb P3; these variations are mentioned because they exist but it is not they that are used, as shall be explained further on. What it is not possible to represent in FIG. 5 is the fact that this displacement towards the left also produces a decrease in the capacitance of the combs P5 and P7 by increasing the spacing between plates and an increase in the capacitance of the combs P6 and P8 by decreasing the spacings between plates. It is this second effect which really contributes to the measurement of the acceleration along Ox.

We shall now explain how the discrimination of the components of displacement (therefore of accelerations) is performed on the basis of the direct or indirect measurements of the capacitances of the various combs.

The example used as a basis is that which was described above, in which:

there are two combs on each side, eight in total for the measurement of the variations in capacitances; all the combs have, at rest, identical facing plate surface areas;

the combs on one and the same side (P1, P2 for example) are symmetric as regards the spacing of the fixed and movable plates in order that a displacement of the mass parallel to this side produces variations in capacitance that are identical but of opposite sign for the two combs;

the combs situated facing one another on two opposite sides (P1, P3 for example) have an inter-plate spacing arrangement such that the displacement of the mass parallel to these sides produces variations in capacitance that are identical and of the same sign for the two combs;

the combs situated facing one another on two opposite sides exhibit a dissymmetry of plate heights: fixed plates lower than the movable plates for one comb, movable plates lower than the fixed plates for the other comb;

the diagonally opposite combs (P1, P4 for example) have relative heights of plates that are identical: if P1 has fixed plates that are lower than the movable plates, then so does P4; the combs P6 and P7 are assumed identical to the combs P1 and P4;

finally, the height of the fixed plates which are higher is equal to the height of the movable plates which are higher, and likewise the height of the fixed plates which are lower is equal to the height of the movable plates which are lower, so that the capacitances at rest of all the combs are identical independently of the fact that the combs have their fixed plate or their movable plate higher than the other.

The symmetry is such that all the comb capacitances are identical at rest, and all the dissymmetries which could exist are eliminated as far as possible by working in relative mode.

We call:

$C_0$ the value of the capacitance at rest of each of the combs;

Ci (i=1 to 8) the capacitance of the comb Pi presence of an acceleration, dCiv the variation of the capacitance Ci specifically due to a vertical acceleration (therefore due to the variation in facing plate surface areas following a displacement of the proof mass in the vertical direction Oz);

dCixe the variation of the capacitance Ci due to a modification of plate spacing (and not of facing surface areas) in the direction Ox; dCixe is zero for i=1, 2, 3, 4 and nonzero for i=5, 6, 7, 8;

dCiye the variation of the capacitance Ci due to a modification of plate spacing (and not of facing surface areas) in the direction Oy; dCiye is zero for i=5, 6, 7, 8 and nonzero for i=1, 2, 3, 4;

dCixs the variation of the capacitance Ci due to a modification of facing plate surface areas (and not of spacing) following a displacement in the direction Ox; dCixs is zero for i=5, 6 7, 8 and nonzero for i=1, 2, 3, 4;

finally dCiys the variation in capacitance due to a modification of facing plate surface areas (and not of spacing) following a displacement in the direction Oy; dCiys is zero for i=1, 2, 3, 4 and nonzero for i=5, 6, 7, 8.

The value of any comb capacitance is theoretically:

Ci=$C_0$+dCiv+dCixe+dCixs+dCiye+dCiys, that is to say it is the sum of the value at rest and of all the possible variations, of spacing or of facing plate surface areas, taking account of the fact that some of these components may be zero if a displacement in a direction has no influence on the value of the capacitance.

Finally, by symmetry, the components dCiye are equal and of opposite sign for two adjacent combs placed on a side parallel to Oy, and equal and of the same sign for two facing combs on the two opposite sides parallel to Oy: for example dC1ye=−dC2ye=dC3ye; the same holds for the components dCixe for the combs placed on the sides parallel to Ox: for example dC5xe=−dC6xe=dC7xe;

the components dCixs are identical and of the same sign for two combs placed on the same side, and identical and of converse sign for two combs placed on the opposite side: for example dC1xs=dC2xs=−dC3xs=−dC4xs;

the components dCiv are all equal for the combs of the same nature as regards the height of the plates: the components dC1v, dC4v, dC6v, dC7v of the combs which have their fixed plate of smaller height than their movable plate are all equal; the components dC2c, dC3v, dC5v, dC8v of the combs which have their fixed plate of larger height than the movable plate are all equal; in the presence of an upward acceleration, the former ones are nonzero and the latter ones are zero; in the presence of a downward acceleration, the converse holds, the former ones are zero and the latter ones are nonzero.

From all these remarks are derived linear combinations of capacitance values which result only from the influence of the accelerations in the direction Ox or the direction Oy or the direction Oz, and which are insensitive to the accelerations along the other axes. These linear combinations are the following:

$$Cx=(C5+C7)-(C6+C8)$$

Specifically,

C5=$C_0$+dC5v+dC5xe+dC5xs+dC5ye+dC5ys with: dC5xs=0 and dC5ye=0, i.e. C5=$C_0$+dC5v+dC5xe+dC5ys C7=$C_0$+dC7v+dC7xe+dC7xs+dC7ye+dC7ys with: dC7xs=0, dC7ye=0, dC7xe=dC5xe, dC7ys=−dC5ys i.e. C7=$C_0$+dC7v+dC5xe−dC5ys and therefore C5+C7=2$C_0$+dC5v+dC7v+2dC5xe, the values dC5ys being compensated by the values dC7ys.

Likewise,

C6+C8=2$C_0$+dC6v+dC8v+2dC6xe, with dC8v=dC5v, dC6v=dC7v, dC6xe=−dC5xe and therefore C6+C8=2$C_0$+dC5v+dC7v−2dC5xe hence it follows that Cx=(C5+C7)−(C6+C8)=4dC5xe; this linear combination Cx does not depend on the accelerations along y and z: it represents a variation in capacitance due exclusively to a displacement along Ox since the variation of dCixe is a variation specifically due to a displacement along Ox; by measuring the value of this combination Cx, it is possible to directly determine the displacement, therefore the acceleration experienced along the axis Ox.

By making the same calculation, it may be shown that the linear combination

Cy=(C2+C4)−(C1+C3)=4dC2ye makes it possible to calculate the acceleration along Oy.

Finally, a linear combination involving the eight capacitance values C1 to C8 makes it possible to get back to the value of the displacement along Oz therefore to the acceleration along Oz.

This linear combination is Cz, with

Cz=(C2+C3+C5+C8)−(C4+C1+C6+C7)

Each of these terms experiences a variation due to the displacements along Ox, Oy and Oz:

a). displacement along Oz:

1. the first four terms C2, C3, C5, C8 are the capacitances of the combs whose movable plates are lower than their fixed plates; they do not vary during a displacement of the proof mass upwards;

2. the other four capacitances decrease during an upward acceleration; the global variation of Cz is therefore positive during an upward acceleration;

3. for a downward acceleration, the reverse holds: the variation of Cz is globally negative because the first four terms decrease while the second four terms do not vary.

b). displacement along Ox:

1. the variations in capacitance of C2 and C3 compensate one another as regards the variation due to the variation in facing surface areas along Ox; likewise for C1 and C4; the variations in facing surface area for a displacement along Ox are zero for C5, C6, C7 and C8;

2. the variations due to the spacing of the plates relate only to C5, C6, C7, C8; they are zero but they compensate one another for C6 and C7 on the one hand, for C5 and C8 on the other hand.

c). displacement along Oy:

1. the variations due to the facing surface area modifications are zero for C1, C2, C3, C4; they compensate one another for C5 and C8, as well as for C6 and C7.

2. the variations due to the spacing modifications are zero for C5 to C8; they are nonzero but compensate one another for C2 and C3 on the one hand, C1 and C4 on the other hand.

We then find:

Cz=4Cd2v−4Cd1v

If the acceleration is upwards, the term Cd2v is zero, the variation in capacitance C1 is negative (the capacitance decreases since the facing surface areas decrease), and the term Cz is positive.

If the acceleration is downwards, the term Cd1v is zero, the variation in capacitance C2 is negative (the facing surface areas decrease) and the term Cz is negative.

Through this linear combination Cz is therefore obtained the amplitude of a variation in capacitance due exclusively to a vertical displacement, therefore a value of vertical displacement and of vertical acceleration, with its sign.

The arrangement which has been described is the most symmetric and therefore advantageous, but it will be understood that it is possible to find other arrangements (and therefore other linear combinations) that are less symmetric but also operative and that make it possible to establish linear combinations capable of isolating the capacitance variations due to each of the components of the acceleration.

The accelerometer comprises, in addition to the mechanical elements which have been described, the means for measuring capacitances and for adding/subtracting capacitances which allow the establishment of the linear combinations above.

In accordance with a known general principle, it is possible to perform the acceleration measurement in a nonslaved manner or in a slaved manner. If a nonslaved manner is employed, one merely measures the capacitances, calculates the linear combinations, and deduces therefrom the displacements of the mass under the effect of the various components of the acceleration. These displacements are limited by the restoring force exerted by the membrane 12 which supports the proof mass M, thereby establishing a relationship between the displacement and the restoring force, therefore a relationship between the displacement and the acceleration and therefore a relationship between a variation in capacitance Cx, Cy or Cz and the acceleration. If the sensor operates in a slaved manner, the measurement is different: an electrostatic motor is provided for applying to the proof mass a force which tends to keep it in its rest position if the measurement of capacitances shows that it has deviated therefrom, and the currents or voltages that it is necessary to apply to the motor to keep the mass in its rest position despite the acceleration that it experiences are measured.

The simplest is to use, as motors, interdigitated combs similar to the measurement combs described above, and to apply to these combs voltages which generate the electrostatic forces tending to return the mass to its rest position. There are then four combs on each side in addition to the measurement combs. However, as is known, it is also possible to use the same combs to make the capacitance measurement and to serve as electrostatic motors, by performing for example a time-division multiplexing to alternate measurement and actuation, or a stack of voltages.

Whether or not they are the same combs, the restoring combs receive voltages whose combination is suitable for exerting the appropriate restoring forces along all the components. If they are constituted like the measurement combs P1 to P8, it is possible to apply voltages V1 to V8 to the respective restoring combs which will meet the following criteria:
- the difference between the slaving voltages (for example V5-V6) applied to two combs (for example P5, P6) whose spacings vary inversely in the direction Ox is all the larger the larger the linear combination Cx;
- the difference of the slaving voltages (for example V2-V1) applied to two combs (P1, P2) whose spacings vary inversely in the direction Oy is all the larger the larger the linear combination Cy;
- the voltages (V1, V4, V6, V7) applied to the combs whose fixed plates are lower than the movable plates are all the higher, with respect to the voltages (V2, V3, V5, V8) applied to the other combs, the higher is Cz, when Cz is positive (upward acceleration);
- the voltages (V2, V3, V5, V8) applied to the combs whose movable plates are lower than the fixed plates are all the higher, with respect to the voltages (V1, V4, V6, V7) applied to the other combs, the higher is the absolute value of Cz, when Cz is negative (downward acceleration).

Fabrication of the Accelerometer:

To produce the accelerometer according to the invention it is possible to use several fabrication methods, examples of which are given hereafter.

In a first example (FIG. 6), one starts from a silicon substrate which is preferably a substrate of SOI (silicon on insulant) type composed of a silicon wafer 60 having at its upper part a fine buried silicon oxide layer 62 a few micrometers in thickness at the maximum (for example 1 micrometer), itself covered with an epitaxial silicon layer 64 a few micrometers in thickness at the maximum (for example 2 micrometers) which will form the support membrane of the proof mass.

Figure 7:
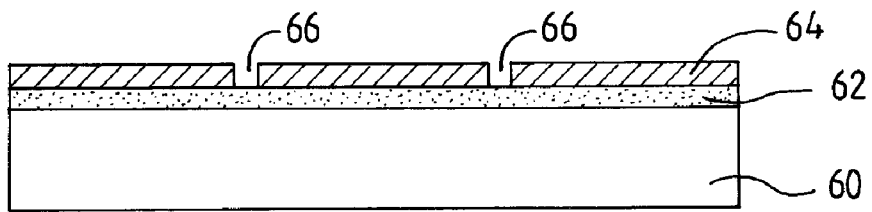

Point-like openings 66 distributed throughout the zone which will define the membrane are opened in the epitaxial silicon layer 64; these openings will subsequently serve to attack the subjacent silicon oxide layer 62 (FIG. 7).

Figure 8:
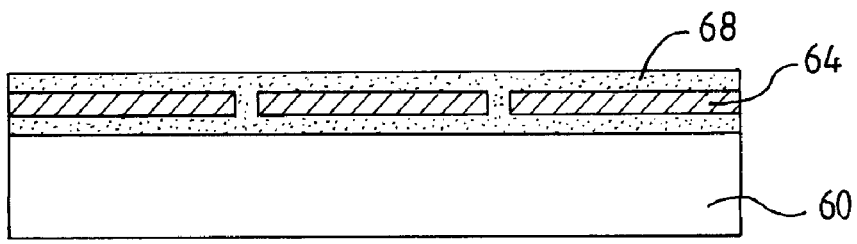

A silicon oxide layer 68 of a few micrometers (for example 5 micrometers), which covers the entire surface of the substrate and fills in the openings 66, is deposited (FIG. 8).

Figure 9:
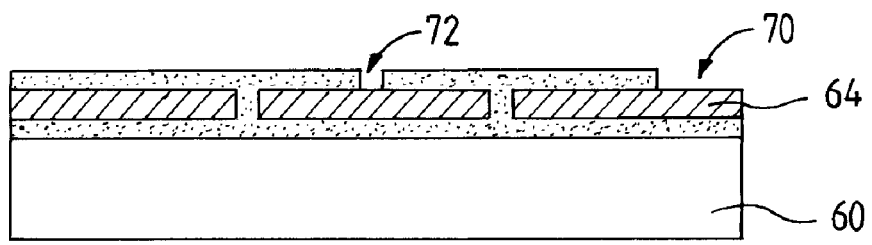

This layer is etched locally so as to eliminate the oxide in at least one zone 70 serving for the electrical link between the membrane (and subsequently the proof mass) and the outside, so as to be able to bring the proof mass to a determined potential (earth for example); in the course of this etching, a point-like opening 72 is also opened at the centre of the zone reserved for the membrane, so as to define what will be the point of attachment of the proof mass with the membrane (FIG. 9).

Figure 10:
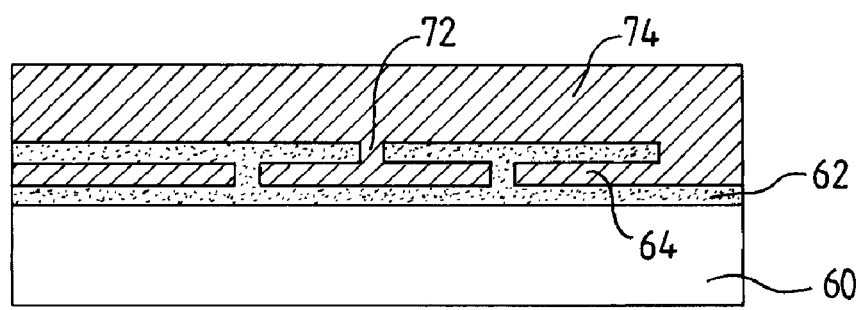

A monocrystalline silicon layer 74 which comes into direct contact with the electrical link zones 70 and which also binds with the epitaxial layer 64 through the point-like opening 72 is deposited by epitaxy. The silicon which fills the opening 72 will constitute the central stud 14 mentioned in regard to FIG. 2. The thickness of the epitaxy formed at this juncture is for example about 25 micrometers. This silicon layer will constitute at one and the same time the proof mass and the interdigitated combs, both for the movable plates and for the fixed plates. The silicon is doped sufficiently to be conducting and to be able to serve directly as capacitance plates of the interdigitated combs. It will be noted that the silicon grows in a monocrystalline manner at least at the contacts with the subjacent monocrystalline silicon of the layer 64, that is to say at the location of the openings 70 and 72, but it can remain polycrystalline in the zones distant from these contact points (FIG. 10).

Figure 11:
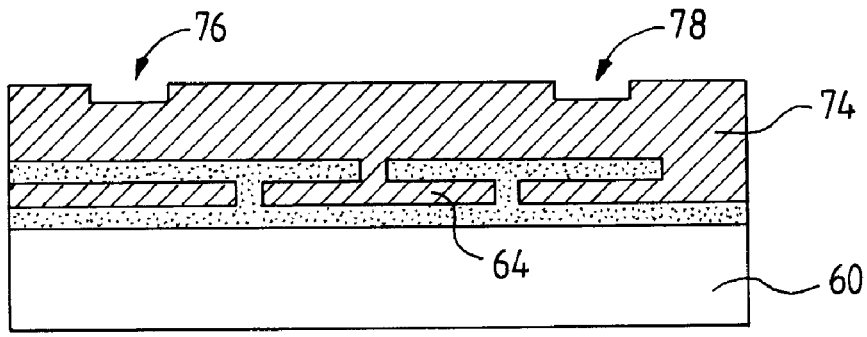

The silicon layer 74 is thinned down locally by partial local etching in zones which define the comb plates of smaller height, whether they be fixed (zones 76) or movable plates (zones 78); (FIG. 11). In the figures the drawing has been simplified by representing only one fixed plate on the left and one movable plate on the right, without showing the interdigitation which would not be easy to represent in a view in vertical section; the zones 76 and 78 are however etched accurately so as to reduce the height of the fixed (or movable) plates inside a comb without reducing the height of the facing plates inside the same comb.

It will be noted that the different plate heights can be defined not as a sunken hollow in respect of the plates to be lowered but as a projection in respect of plates to be elevated to give to them a greater height. In this case, instead of etching the zones 76 and 78, the entire remainder of the surface is etched, leaving the zones 76 and 78 projecting.

Figure 12:
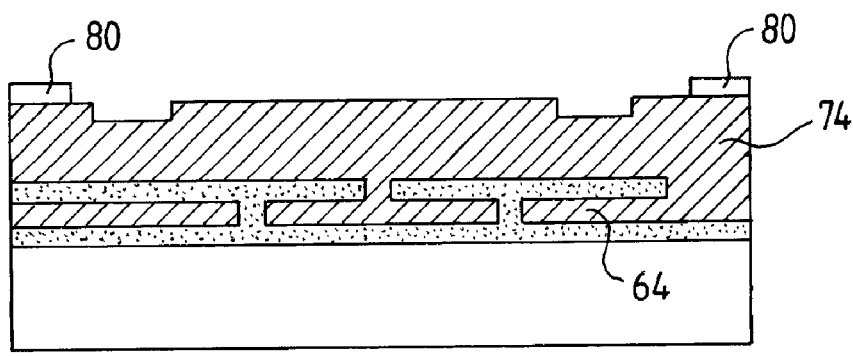

A metallic layer 80 is thereafter deposited and etched to take electrical contacts with the various comb plates. The movable plates all will be at the same potential, being secured to the proof mass which is globally conducting, and the right contact will remain linked to the membrane therefore to the proof mass so as to bring the latter to the desired potential. Conversely, the fixed combs must be able to be connected separately to implements for measuring potential or for applying potential and a separate contact per comb is envisaged (FIG. 12).

Figure 13:
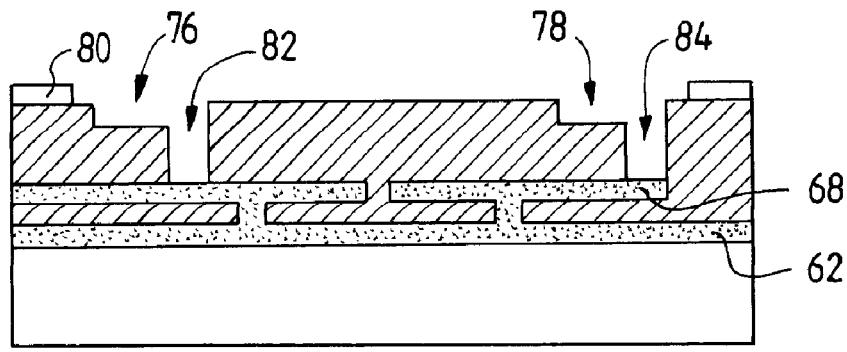

The entire thickness of the silicon of the layer 74 is etched so as to define on the one hand the proof mass M, on the other hand each of the fixed combs insulated from the other combs and to define each of the fixed or movable plates of each of these combs. FIG. 13 represents only symbolically two separating openings 82 and 84 between the proof mass, at the centre, and the combs, on the right and on the left but in reality this etching operation defines each gap between two facing plates, fixed and movable. The etching of the silicon is stopped on the insulant layer 68.

Figure 14:
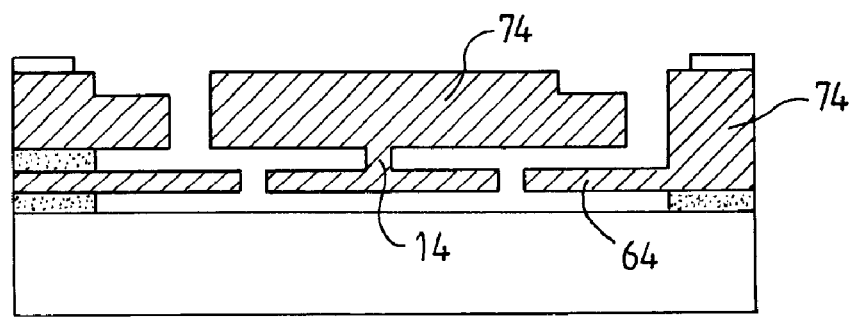

Through the openings thus etched in the silicon layer, the silicon oxide of the layers 68 then 62 is attacked by anisotropic etching. For the latter, the dissolution of the oxide, for example with hydrogen fluoride, is done through the openings 66 which had been made in the step of FIG. 7. The etching of the oxide allows some oxide to remain which binds the combs and the starting substrate 60 (FIG. 14). This yields the accelerometer structure defined in FIGS. 1 and 2 with the silicon layer 74 so as to serve as suspended proof mass and as movable and fixed comb plates, and the silicon layer 64 so as to serve as suspended membrane, a central silicon stud 14 binding the membrane and the mass at the centre of the latter.

Figure 6:
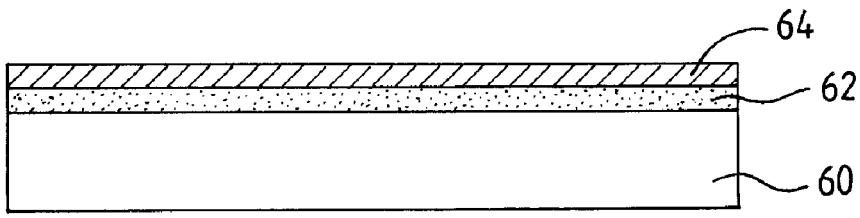
FIGS. 6 to 14 represent the various steps of an exemplary method of fabricating the sensor according to the invention.
Figure 15:
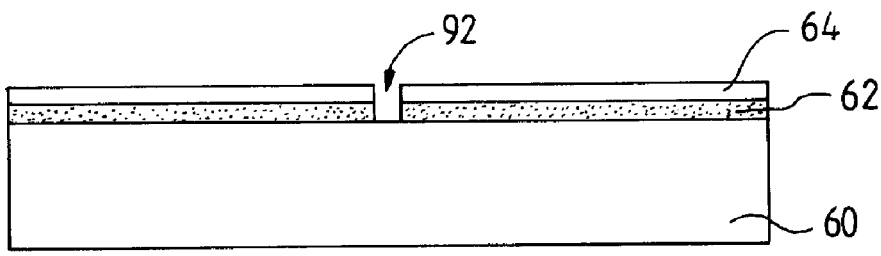
FIGS. 15 to 18 represent the steps of another exemplary method of fabrication.

In another fabrication technique represented in FIGS. 15 to 18 one proceeds in the following manner:

One starts from a substrate similar to that of FIG. 6: SOI substrate composed of a silicon wafer 60 with a buried silicon oxide layer 62 covered with a silicon layer 64. An opening 92 is opened in these two layers at the location which is to constitute the central linking stud 14 between the proof mass and the membrane (FIG. 15).

Figure 16:
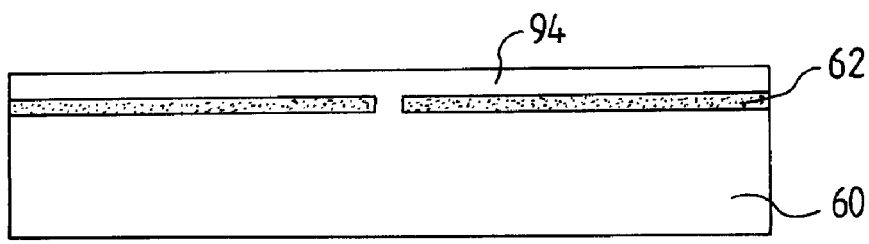

A silicon layer which, on the one hand, fills in the opening 92 while constituting the future central linking stud between the proof mass and the support membrane, and, on the other hand, increases the thickness of the pre-existing layer 64, is deposited. The silicon layer 94 thus constituted above the oxide 62 will constitute the support membrane for the proof mass (FIG. 16).

Figure 17:
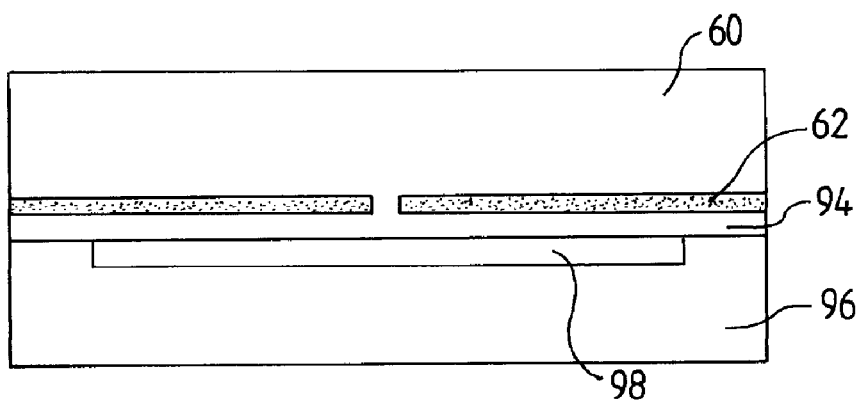

The substrate thus produced is turned round so that the layer 94 is now underneath, and this substrate is adhesively bonded via its front face, that is to say via the side of the layer 94, onto another substrate 96 which possesses a surface cavity 98 occupying the entire zone reserved for the membrane. The substrates 60 and 96 are therefore adhesively bonded only at their periphery and the silicon layer 94 lies suspended above the cavity 98 (FIG. 17).

Figure 18:
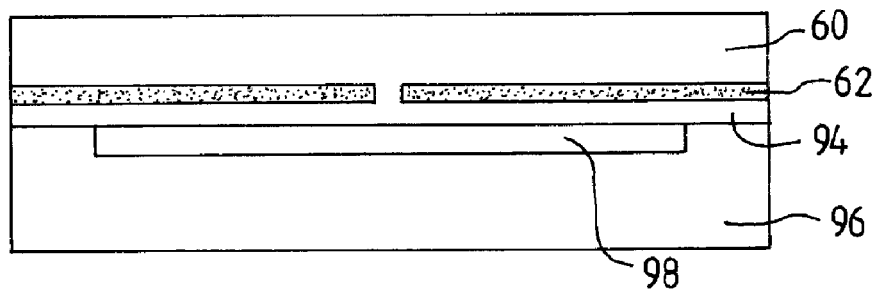

The rear face of the substrate 60 is then thinned down, by mechanical and chemical machining, until it has the thickness which is desired for the proof mass, for example 50 micrometers or less (FIG. 18). The chosen thickness is a thickness allowing easy and accurate etching of the interdigitated comb plates.

The following steps are the same as those which were explained with reference to FIGS. 11 to 14 and will not be described again: hollowing out of the silicon to define the zones of plates that are lower or higher than the other plates; formation of the electrical contacts, etching of the interdigitated combs, and finally dissolution of the silicon oxide layer 62 through the openings made by etching the combs, so as to free the membrane constituted by the silicon layer 94.

What is claimed is:

1. A micro-machined three-axis accelerometer structure, comprising:
    a substrate, an elastically deformable thin-layer membrane suspended above the substrate and secured to the substrate at a periphery of the membrane,
    a proof mass suspended above the membrane and linked to the membrane by a central stud located at a center of the membrane, and
    capacitive interdigitated combs formed along a first and second parallel sides of the proof mass and along a third and fourth parallel sides of the proof mass, said combs comprising movable plates secured to the mass and fixed plates secured to the substrate,
    means for producing a first linear combination of the capacitance values of combs formed along said first and second parallel sides of the proof mass, said first linear combination representing an acceleration along a horizontal axis parallel to said first and second sides of the proof mass,
    means for producing a second linear combination of the capacitance values of combs formed along said first, second, and third and fourth sides of the proof mass, said second linear combination representing an acceleration along a vertical axis perpendicular to the membrane, and
    means for producing a third linear combination of the capacitance values of combs formed along said third and fourth parallel sides of the proof mass, said third linear combination representing an acceleration along a horizontal axis parallel to said third and fourth sides of the proof mass.

2. The accelerometer structure according to claim 1, wherein the fixed plates of some of the capacitive combs have a height, measured in a sense perpendicular to the membrane, that is smaller than a height of the movable plates of these combs, and the movable plates of some combs have a height in a sense perpendicular to the membrane that is smaller than a height of the fixed plates of these combs.

3. The accelerometer structure according to claim 2, wherein, on each side of the proof mass there are two combs, one having fixed plates higher than the movable plates and the other having movable plates higher than the fixed plates.

4. The accelerometer structure according to claim 3, wherein the two combs on one and the same side of the proof mass have spacings between plates which vary in opposite senses for one and the same sense of horizontal displacement of the proof mass.

5. The accelerometer structure according to claim 4, wherein two combs facing one another on two opposite sides have, the one, fixed plates higher than the movable plates and, the other, movable plates higher than the fixed plates.

6. The accelerometer structure according to claim 3, wherein any pair of two combs facing one another on two opposite sides of the proof mass have spacings between plates which vary in the same sense for one and the same displacement of the proof mass parallel to these sides.

7. The accelerometer structure according to claim 1, wherein the interdigitated capacitive combs have a symmetric organization such that the capacitances at rest in the absence of accelerations of all the interdigitated combs are identical.

8. The accelerometer structure according to claim 1, wherein a said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

9. The accelerometer structure according to claim 1, wherein the proof mass (M), the interdigitated combs, the membrane and the central stud are made of silicon.

10. The accelerometer structure according to claim 4, wherein any pair of two combs facing one another on two opposite sides of the proof mass have spacing between plates which vary in the same sense for one and the same displacement of the proof mass parallel to these sides.

11. The accelerometer structure according to claim 5, wherein any pair of two combs facing one another on two opposite sides of the proof mass have spacing between plates which vary in the same sense for one and the same displacement of the proof mass parallel to these sides.

12. The accelerometer structure according to claim 2, wherein the interdigitated capacitive combs have a symmetric organization such that the capacitances at rest in the absence of accelerations of all the interdigitated combs are identical.

13. The accelerometer structure according to claim 2, wherein said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

14. The accelerometer structure according to claim 3, wherein said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

15. The accelerometer structure according to claim 4, said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

16. The accelerometer structure according to claim 5, wherein said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

17. The accelerometer structure according to claim 6, wherein said second linear combination is the difference between the sum of the capacitances of four combs each situated on a respective side of the proof mass and having fixed plates that are lower than the movable plates, and the sum of the capacitances of four other combs also each situated on a respective side of the proof mass and having movable plates that are lower than the fixed plates.

* * * * *